United States Patent
Lu et al.

(10) Patent No.: US 9,690,888 B2
(45) Date of Patent: Jun. 27, 2017

(54) METHOD AND APPARATUS FOR SYSTEM DESIGN VERIFICATION

(71) Applicant: FREESCALE SEMICONDUCTOR, INC., Austin, TX (US)

(72) Inventors: Xiangdong Lu, Suzhou (CN); Wangsheng Mei, Suzhou (CN); Prashant U. Naphade, Austin, TX (US)

(73) Assignee: NXP USA, INC., Austin, TX (US)

( * ) Notice: Subject to any disclaimer, the term of this patent is extended or adjusted under 35 U.S.C. 154(b) by 48 days.

(21) Appl. No.: 14/887,335

(22) Filed: Oct. 20, 2015

(65) Prior Publication Data
US 2016/0306913 A1    Oct. 20, 2016

(30) Foreign Application Priority Data
Apr. 20, 2015  (CN) .......................... 2015 1 0328734

(51) Int. Cl.
*G06F 17/50*    (2006.01)
(52) U.S. Cl.
CPC ................. *G06F 17/5022* (2013.01)
(58) Field of Classification Search
CPC ....................................... G06F 17/50
USPC ........................................... 716/136
See application file for complete search history.

(56) References Cited

U.S. PATENT DOCUMENTS

| | | |
|---|---|---|
| 6,275,868 B1 | 8/2001 | Fraley et al. |
| 6,571,373 B1 | 5/2003 | Devins et al. |
| 7,797,677 B1 | 9/2010 | Ballagh et al. |
| 2003/0225565 A1* | 12/2003 | Garcia ............... G06F 17/5022 703/23 |
| 2008/0300846 A1 | 12/2008 | Voges et al. |

OTHER PUBLICATIONS

Bryon Moyer, "TCL Drives C Drives SystemVerilog", Electronic Engineering Journal, Aug. 26, 2008.

\* cited by examiner

*Primary Examiner* — Thuan Do
(74) *Attorney, Agent, or Firm* — Charles E. Bergere

(57) ABSTRACT

An apparatus for system design verification has a test case module for compiling a test case in a scripting language (such as TCL) and a testbench including the design under test and operating with a Hardware Descriptor Language (such as SystemVerilog). A stimulus generated by the test case module is applied to the testbench through an interface gasket based on 'C'.

9 Claims, 3 Drawing Sheets

METHOD AND APPARATUS FOR SYSTEM DESIGN VERIFICATION

BACKGROUND OF THE INVENTION

The present invention relates generally to the testing of system designs by software simulation, and more particularly, to a verification process incorporating stimuli generated by scripting and modelling languages.

Integrated circuit development generally includes a design phase and a verification phase for determining whether a design works as expected. The verification phase typically uses a software simulator (or testbench) whose functions include accepting software written in a hardware description language such as SystemVerilog, which models a circuit design. The model is used to simulate the response of the design to stimuli that are applied by a test case. The results are observed and used to debug the design. A test case is generally a set of test conditions and characterised by a known input and an expected output. The most time consuming part is creating the tests and then modifying them when the design changes. SystemVerilog is currently a popular language for a testbench and test case. Scripting languages such as TCL (Tool Command Language), and/or modelling languages can be useful for test case emulation.

Hence it would be advantageous to be able to incorporate verification components that have been coded by a scripting language into a SystemVerilog testbench.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
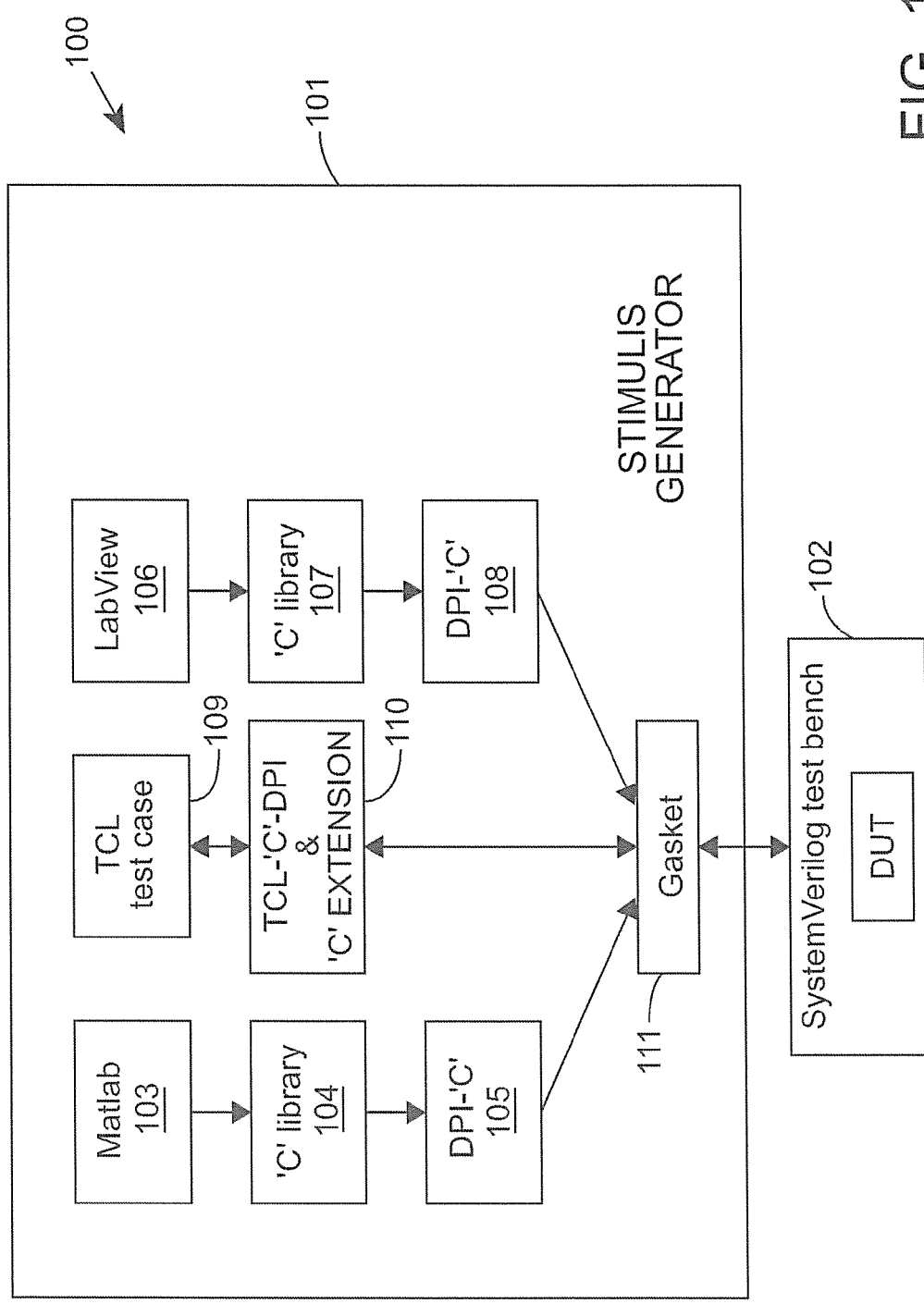
FIG. 1 is a simplified, schematic block diagram of a system verification apparatus in accordance with one embodiment of the invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, the terms "comprises," "comprising," or any other variation thereof, are intended to cover a non-exclusive inclusion, such that module, circuit, device components, structures and method steps that comprise a list of elements or steps do not include only those elements but may include other elements or steps not expressly listed or inherent to such module, circuit, device components or steps. An element or step proceeded by "comprises . . . a" does not, without more constraints, preclude the existence of additional identical elements or steps that comprise the element or step.

In one embodiment, the present invention provides an apparatus for system design verification. The apparatus comprises a test case module for compiling a test case in a scripting language including at least one stimulus, a testbench including a design under test (DUT) and operating with a hardware descriptor language (HDL), and an interface, based on the programming language 'C,' connected between the test case module and the testbench for interfacing stimuli applied to the DUT.

In another embodiment, the present invention provides a method for system design verification. The method comprises compiling a test case in a scripting language including at least one stimulus, applying the stimulus to a testbench including a DUT and operating with a HDL through an interface based on 'C.'

Advantageously, the invention permits the use of languages such as TCL script, Matlab and Labview to provide the stimulus for a SystemVerilog-based testbench. In one embodiment a 'C' command procedure is used to call TCL, Matlab or LabView stimuli. Further advantages are an easing of the testbench architecture compilation partition and a saving in compilation time, making a simulation more efficient and re-usable. In one embodiment, the use of the C programming language in an intermediate stage permits a SystemVerilog testbench to use scripting and modelling language stimuli in order to run simulations with compilation being done only once. The invention can also be applied to emulation tests where a front end testbench can be re-used and save compilation time for different test cases.

Referring now to FIG. 1, a simplified schematic block diagram of system verification apparatus 100 is shown. The system verification apparatus 100 includes a stimulus generator 101 and a SystemVerilog testbench 102. The SystemVerilog testbench includes a design under test (DUT). Generated stimuli are applied to the DUT and responses are analyzed by comparison with expected responses. The DUT is typically a software model of a logic design, for example. The SystemVerilog testbench 102 simulates the behavior of a hardware device corresponding to the software model in response to test stimuli from the stimulus generator 101. The SystemVerilog testbench 102 operates using a hardware description language (HDL) that in this example is SystemVerilog.

A typical test procedure carried out by the testbench 100 has two parts, namely, a compilation part and simulation part. In a compilation flow, the DUT is compiled to one or more internal libraries. In a simulation flow, a simulation is run by the SystemVerilog testbench based on the compilation results.

Referring to the stimulus generator 101 in more detail, a Matlab module 103 compiles Matlab code into a first 'C' library 104 as test case and test data. This includes script commands and stimuli in script. The first 'C' library 104 also includes a C to API (Application Program Interface) interface function. A Matlab reference model compiled to 'C' library cannot be used directly as a stimulus so the 'C' library-API interface capability summarizes and arranges a stimulus into standard tasks or methods to be handled by subsequent stages. These standard tasks can comprise detailed stimulus configuration information. A first DPI-'C' module 105 is connected to the first 'C' library 104 and performs a Direct Programming Interface to a subsequent stage. The 'C' method cannot be called directly in SystemVerilog testbench but through a Direct Programming Interface, a 'C' method to SystemVerilog can be mapped. Similarly, SystemVerilog to 'C' can also be mapped.

A LabView module 106 is provided for compiling LabView code into a second 'C' library 107. In this example, the second C library 107 is a Field Programmable Gate Array (FPGA). The second 'C' library 107 is connected to a second DPI-'C' module 108. The second DPI-'C' module 108 performs a function similar to that performed by the first DPI-'C' module 105.

A TCL test case module 109 compiles stimuli (in scripting language) and a test case (also in scripting language) for a verification test. The test case includes all the TCL commands for controlling an entire stimulus flow. In a manner to be explained below, the script test case controls the whole communication flow in the SystemVerilog testbench 102 with commands such as 'trigger event,' 'wait event,' 'time delay,' and 'end of test.' The TCL test case module 109 is connected to a TCL-'C'-DPI module 110. A TCL file cannot be used directly by SystemVerilog through DPI so a 'C' extension (or interlocutory) file residing in the TCL-'C'-DPI DPI module 110 is used to map a script command to a DPI task. The TCL-'C'-DPI module 110 also contains a gasket SystemVerilog file. The module 110 facilitates the communication of data and feedback between the TCL test case module 109 and the SystemVerilog testbench 102. By virtue of the TCL-'C'-DPI module 110, a TCL test case can be turned into a DPI task. The first and second DPI-'C' modules 105, 108 and the TCL-'C'-DPI module 110 are connected to an interface gasket 111.

The gasket 111 converts the TCL, Matlab and LabView information into testbench information. There are three files that are handled by the gasket. TCL test case and 'C' test case are top level test cases that include the whole stimulus flow based on the compilations of the TCL test case module 109 and of the Matlab and LabView modules 103, 106 respectively. The gasket 111 is configured to call 'generate transaction,' 'delay special time,' 'trigger event,' 'wait event' and 'end_of_test' tasks from either TCL procedures or 'C' tasks from the libraries 104, 107. The test case is invoked by the extension 'C' file including all the TCL procedures and 'C' tasks definition. The lowest level file is defined herein as 'gasket file' that defines a 'put' transaction, a 'get' transaction, 'trigger event,' 'wait event,' 'info_logger' and 'end_of_test' using SystemVerilog language. In the extension 'C' file, the TCL procedure and the 'C' tasks are each bonded with a SystemVerilog gasket file through DPI. An output of the gasket 111 is fed to the SystemVerilog testbench 102. A SystemVerilog stimulus received via the gasket 111 at the System Verilog testbench 102 will invoke the generated TCL test case. The SystemVerilog testbench 102 can send data and/or response feedback to the TCL test case module 109 via the gasket 111.

Figure 2:
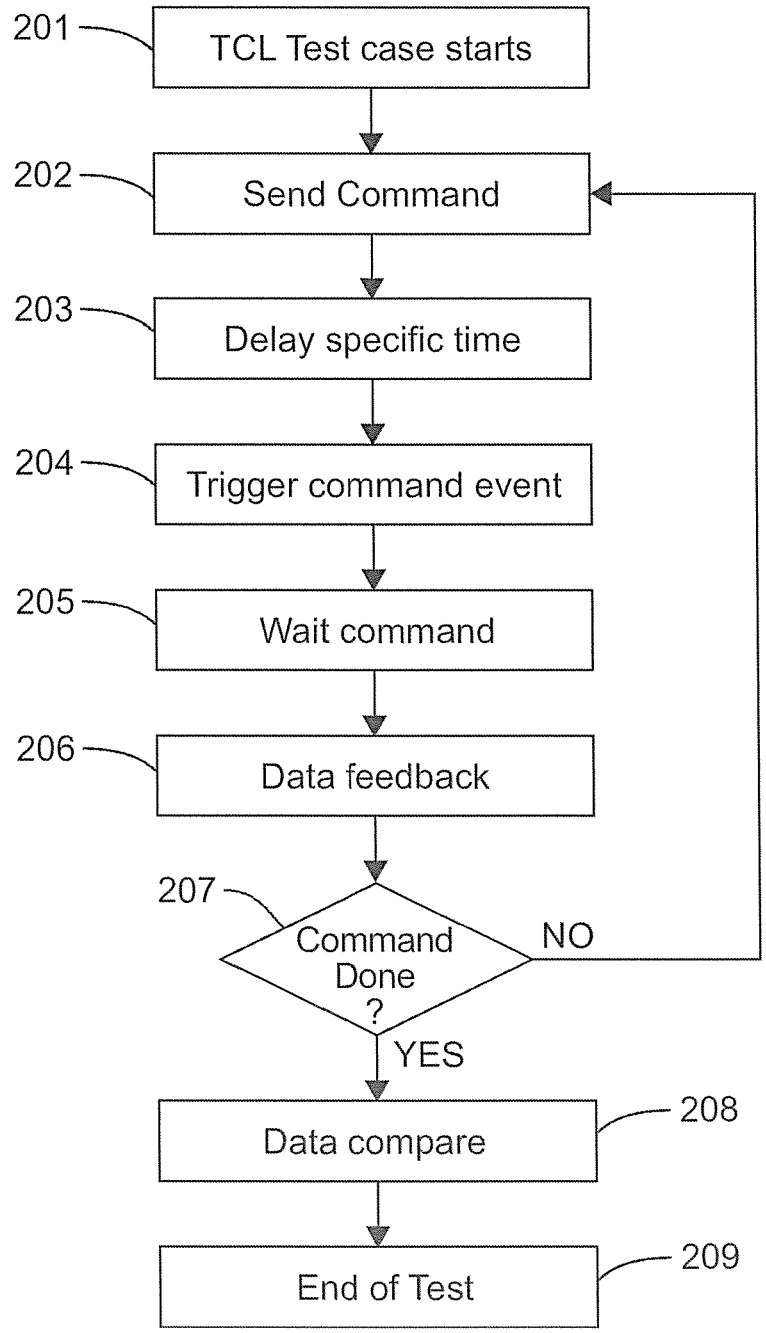
FIG. 2 is a simplified flow chart illustrating one example of a method of operation of the system verification apparatus of FIG. 1.

Referring to FIG. 2, a flow chart is shown where at step 201, a TCL test case starts and the TCL test case module 109 configures a number of commands.

At step 202, a TCL command generated by the TCL test case module 109 is sent via the gasket 111 (where it is converted to testbench information) to the SystemVerilog testbench 102.

At step 203, a specific time period is allowed to elapse in order to ensure that a command has been completed before a simulation run commences.

At step 204, a command event is triggered by the TCL test case module 109 and received at the SystemVerilog testbench 102.

At step 205, a wait command is generated by the TCL test case module 109 and received at the SystemVerilog testbench 102.

At step 206, data feedback from the DUT is sent from the SystemVerilog testbench 102 to the stimulus generator. This data feedback includes triggered events and SystemVerilog testbench results.

At step 207, if all commands have not yet been completed, the process reverts to step 202 where another command is sent by the TCL test case module 109.

If all commands have been completed, then at step 208, data is compared in the stimulus generator 111. Returned data received from the DUT is compared with TCL test case data generated in the TCL test case module 109. In one example, the comparison is done in the TCL test case module 109.

The process ends at step 209.

Figure 3:
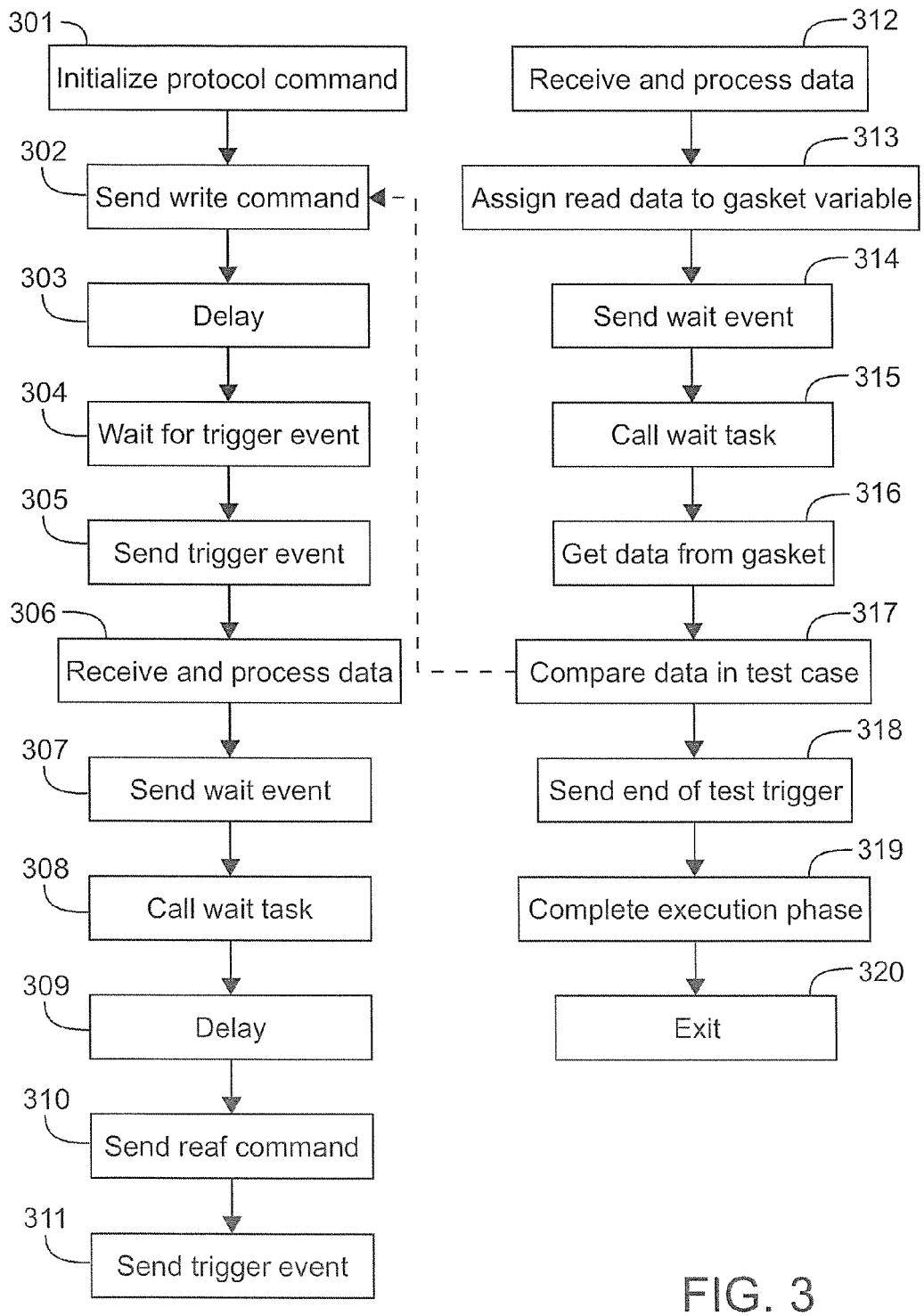
FIG. 3 is a simplified flow chart illustrating the flow of signals and data in a system verification apparatus in accordance with an embodiment of the invention.

FIG. 3 illustrates an example of the flow of signals and data in a system verification apparatus in accordance with one embodiment of the invention.

In a first step 'initialize protocol command' at 301, in SystemVerilog testbench and using an appropriate protocol, an empty SystemVerilog stimulus is generated for receiving TCL transactions.

Next, a write SystemVerilog transaction is generated in the TCL test case. In this step, the defined TCL task 'send_wr_command' is called by the gasket 111. Using the 'C' extension file and through export DPI-C, a put_int instruction is mapped to the TCL task 'PUT'. Hence, at 302, a write command is sent to SystemVerilog testbench.

At 303, a delay instruction is sent from the TCL test case to the SystemVerilog testbench. This requires a TCL_DELAY task be called (by the gasket 111). Conventionally, there is no time concept in script or modelling languages therefore a delay_t task is defined in the gasket 111 in SystemVerilog. Using the 'C' extension file and through export DPI-C a 'delay_t' instruction is mapped to the TCL task 'TCL_DELAY'

At 304, the SystemVerilog testbench waits for the receipt of a trigger event. During this period, the simulation process is halted.

At 305, a trigger instruction is sent by the TCL test case to the SystemVerilog testbench. This requires a TCL_TRIGGER task to be called (by the gasket 111). Conventionally, there is no event concept in script or modelling languages therefore a 'trigger_e' task is defined in the gasket 111 in SystemVerilog. Using the 'C' extension file and through export DPI-C a 'trigger_e' instruction is mapped to the TCL task 'TCL_TRIGGER.'

At 306, on receiving the trigger instruction, the SystemVerilog testbench receives data from the TCL test case and processes it in accordance with conventional techniques. The SystemVerilog testbench puts transaction data from the TCL test case into the initialized command.

At 307, after the SystemVerilog testbench has completed the write command it triggers an event 'w_event' that is sent to the TCL test case. The simulation process in the SystemVerilog testbench is then halted until a further trigger instruction is received.

At 308, on receipt of the 'w_event,' a TCL_WAIT task is called by the gasket. As there is no event concept in script or modelling language, a 'wait_e' task to wait event 'w_event' is defined in the gasket 111. Using the C extension file and through export DPI-C, 'wait_e' is mapped to 'TCL_WAIT.'

At 309, a delay instruction is sent from the TCL test case to the SystemVerilog testbench (as in step 303). This requires a TCL_DELAY task to be called (by the gasket 111). Conventionally, there is no time concept in script or modelling languages therefore a delay_t task is defined in the gasket 111 in SystemVerilog. Using the 'C' extension file and through export DPI-C a 'delay_t' instruction is mapped to the TCL task 'TCL_DELAY'.

Next, a read SystemVerilog transaction is generated in the TCL test case. In this step, the defined TCL task 'send_wr_command' is called by the gasket 111. Using the 'C' extension file and through export DPI-C a put_int instruction is mapped to the TCL task 'PUT'. Hence, at 310, a read command is sent to SystemVerilog testbench. This step is similar to step 302, the difference between read and write commands being in the read_write control bit.

At 311, in a similar fashion to step 305, a trigger instruction is sent by TCL test case to SystemVerilog testbench. This requires a TCL_TRIGGER task to be called (by the gasket 111). Conventionally, there is no event concept in script or modelling languages therefore a 'trigger_e' task is defined in the gasket 111 in SystemVerilog. Using the 'C' extension file and through export DPI-C a 'trigger_e' instruction is mapped to the TCL task 'TCL_TRIGGER.'

At 312, on receiving the trigger instruction, the SystemVerilog testbench receives data from the TCL test case and processes it in accordance with conventional techniques.

At 313, after the SystemVerilog testbench has completed the read command, the read data is assigned to a gasket variable.

At 314 (in a step similar to step 307), the SystemVerilog testbench triggers an event 'w_event' that is sent to the TCL test case.

At 315, (in a step similar to step 308), on receipt of the 'w_event,' a TCL_WAIT task is called by the gasket. As there is no event concept in script or modelling language, a 'wait_e' task to wait event 'w_event' is defined in the gasket 111. Using the C extension file and through export DPI-C, 'wait_e' is mapped to 'TCL_WAIT.'

At 316, the TCL test case gets the read data from the gasket. Using the 'C' extension file and through export DPI-C a 'get_int' instruction is mapped to the TCL task 'GET.'

At 317, in the TCL test case, the read data is compared with the expected data. If there are other commands to be performed, the process will loop back to step 302.

At 318, the test case indicates the 'end of test.' As there is no event concept in script or modelling languages an 'end_of_test task is defined in the gasket in SystemVerilog in order to trigger event 't_event' and to start 'end_flag'. Using the C extension file and through export DPI-C, 'end_of_test' is mapped to TCL task 'TCL_ENDS.'

When the test has ended, and the SystemVerilog testbench has checked and confirmed that 'end_flag' has started, then at 319 the SystemVerilog testbench has completed its execution phase and exits the process at 320.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. An apparatus for system design verification, comprising:
   a stimulus generator for compiling a test case in a scripting language, wherein the test case includes at least one stimulus;
   a testbench including a design under test (DUT), wherein the testbench simulates behavior of the DUT in response to the at least one stimulus, and wherein the testbench operates using a hardware descriptor language; and
   an interface gasket connected between the stimulus generator and the testbench for transmitting the at least one stimulus to the design under test, wherein the interface gasket includes a file defining transactions using a hardware description language.

2. The apparatus of claim 1, wherein the interface gasket is arranged to call the at least one stimulus from the test case using a 'C' command procedure.

3. The apparatus of claim 1, wherein the scripting language is TCL (Tool Command Language) and the hardware description language is SystemVerilog, and wherein the interface gasket includes a 'C' extension file and converts TCL information to SystemVerilog information by mapping, in the 'C' extension file, a TCL command to a DPI (Direct Programming Interface) task.

4. The apparatus of claim 1, wherein the stimulus generator further comprises a Matlab module that compiles Matlab code into a first 'C' library.

5. The apparatus of claim 4, wherein the first 'C' library includes a C to API (Application Program Interface) interface function.

6. The apparatus of claim 5, further comprising a first DPI-'C' module connected to the first 'C' library, wherein the first DPI-'C' module performs a Direct Programming Interface (DPI) to the gasket.

7. The apparatus of claim 4, wherein the stimulus generator further comprises a LabView module that compiles LabView code into a second 'C' library.

8. The apparatus of claim 7, wherein the second 'C' library comprises a Field Programmable Gate Array (FPGA).

9. The apparatus of claim 8, further comprising a second DPI-'C' module connected to the second 'C' library, wherein the second DPI-'C' module performs a DPI to the gasket.

* * * * *